(12) United States Patent
Brick et al.

(10) Patent No.: US 9,046,673 B2
(45) Date of Patent: Jun. 2, 2015

(54) OPTOELECTRONIC APPARATUS

(71) Applicant: OSRAM Opto Semiconductors GmbH, Regensburg (DE)

(72) Inventors: Peter Brick, Regensburg (DE); Julius Muschaweck, Gauting (DE); Joachim Frank, Coburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/177,591

(22) Filed: Feb. 11, 2014

(65) Prior Publication Data
US 2014/0158875 A1    Jun. 12, 2014

Related U.S. Application Data

(62) Division of application No. 12/997,386, filed as application No. PCT/DE2009/000882 on Jun. 25, 2009, now Pat. No. 8,686,452.

(30) Foreign Application Priority Data

Jun. 30, 2008   (DE) .......................... 10 2008 030 819

(51) Int. Cl.
*H01L 33/00* (2010.01)
*H01L 31/0232* (2014.01)
(Continued)

(52) U.S. Cl.
CPC ..... *G02B 19/0028* (2013.01); *H01L 31/022408* (2013.01); *H01L 31/022433* (2013.01);
(Continued)

(58) Field of Classification Search
CPC ............ H01L 33/58; H01L 31/022408; H01L 31/022433; H01L 33/38; H01L 2924/0002; H01L 2924/00; G02B 19/0028; G01J 1/0422; G01J 1/0411

USPC ............ 257/79–84, 88, 98, 99, 428, 431–436
See application file for complete search history.

(56) References Cited

U.S. PATENT DOCUMENTS

| | | |
|---|---|---|
| 4,248,643 A | 2/1981 | Peters |
| 4,638,110 A | 1/1987 | Erbert |

(Continued)

FOREIGN PATENT DOCUMENTS

| | | |
|---|---|---|
| DE | 200 21 916 U1 | 12/1999 |
| DE | 103 19 274 A1 | 12/2004 |

(Continued)

OTHER PUBLICATIONS

Japanese Examination Report dated Aug. 5, 2013 (English translation).

*Primary Examiner* — Julio J Maldonado
*Assistant Examiner* — Cory Eskridge
(74) *Attorney, Agent, or Firm* — DLA Piper LLP (US)

(57) ABSTRACT

An optoelectronic apparatus includes an optical device with an optical structure including a plurality of optical elements and a concentrator which is a hollow body having a reflective inner area, and a radiation-emitting or radiation-receiving semiconductor chip with a contact structure including a plurality of contact elements that make electrical contact with the semiconductor chip and are spaced apart vertically from the optical structure, wherein the contact elements are arranged in interspaces between the optical elements upon projection of the contact structure into a plane of the optical structure, wherein the concentrator has an aperture on a side facing the semiconductor chip that is smaller than a side facing away from the semiconductor chip, and the optical structure is arranged on a side of the concentrator facing the semiconductor chip.

14 Claims, 4 Drawing Sheets

(51) Int. Cl.
  *G02B 19/00* (2006.01)
  *H01L 33/58* (2010.01)
  *F21K 99/00* (2010.01)
  *G01J 1/04* (2006.01)
  *H01L 31/054* (2014.01)
  *H01L 31/0224* (2006.01)
  *H01L 33/38* (2010.01)

(52) U.S. Cl.
  CPC ........... *H01L33/38* (2013.01); *H01L 33/58* (2013.01); *Y02E 10/52* (2013.01); *F21K 9/50* (2013.01); *G01J 1/0411* (2013.01); *G01J 1/0422* (2013.01); *H01L 2924/0002* (2013.01); *H01L 31/0547* (2014.12)

(56) References Cited

U.S. PATENT DOCUMENTS

| | | | |
|---|---|---|---|
| 4,964,713 A | | 10/1990 | Goetzberger |
| 5,123,968 A | * | 6/1992 | Fraas et al. ............ 136/246 |
| 5,344,497 A | | 9/1994 | Fraas et al. |
| 5,959,787 A | | 9/1999 | Fairbanks |
| 6,057,505 A | | 5/2000 | Ortabasi |
| 6,091,017 A | | 7/2000 | Stern |
| 7,467,885 B2 | | 12/2008 | Grötsch et al. |
| 7,637,627 B2 | | 12/2009 | Moffat et al. |
| 7,663,150 B2 | | 2/2010 | Wirth et al. |
| 2005/0081908 A1 | | 4/2005 | Stewart |
| 2006/0185713 A1 | * | 8/2006 | Mook, Jr. ............ 136/244 |
| 2007/0012934 A1 | | 1/2007 | Abu-Ageel |

FOREIGN PATENT DOCUMENTS

| | | |
|---|---|---|
| DE | 10 2005 033 005 A1 | 1/2007 |
| DE | 10 2005 044 580 A1 | 4/2007 |
| DE | 10 2006 045 692 A1 | 4/2008 |
| EP | 0 255 900 A2 | 2/1988 |
| EP | 1 427 025 A2 | 6/2004 |
| EP | 1 605 199 A2 | 12/2005 |
| JP | 2004-047753 A | 2/2004 |
| JP | 2008-532298 A | 8/2008 |
| JP | 2009-507331 A | 2/2009 |
| WO | 01/48830 A1 | 7/2001 |
| WO | 2004/097946 A2 | 11/2004 |
| WO | 2006/089508 A1 | 8/2006 |
| WO | 2007/025538 A2 | 3/2007 |
| WO | 2007/063489 A1 | 6/2007 |

* cited by examiner

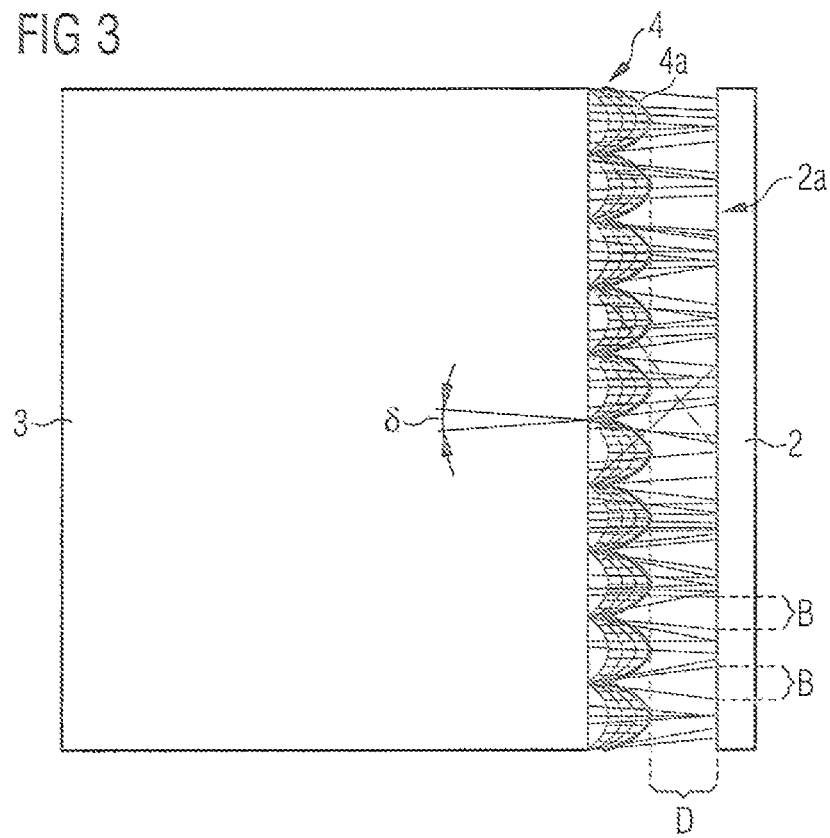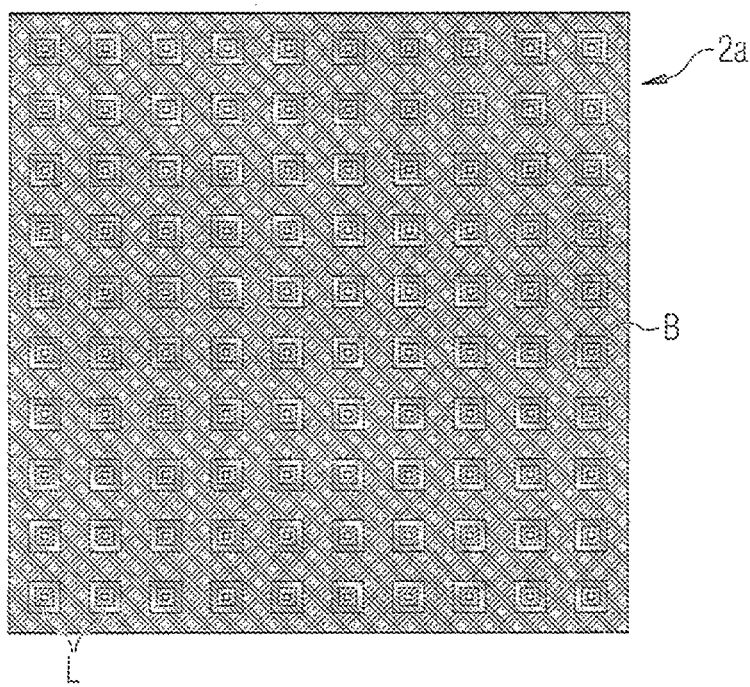

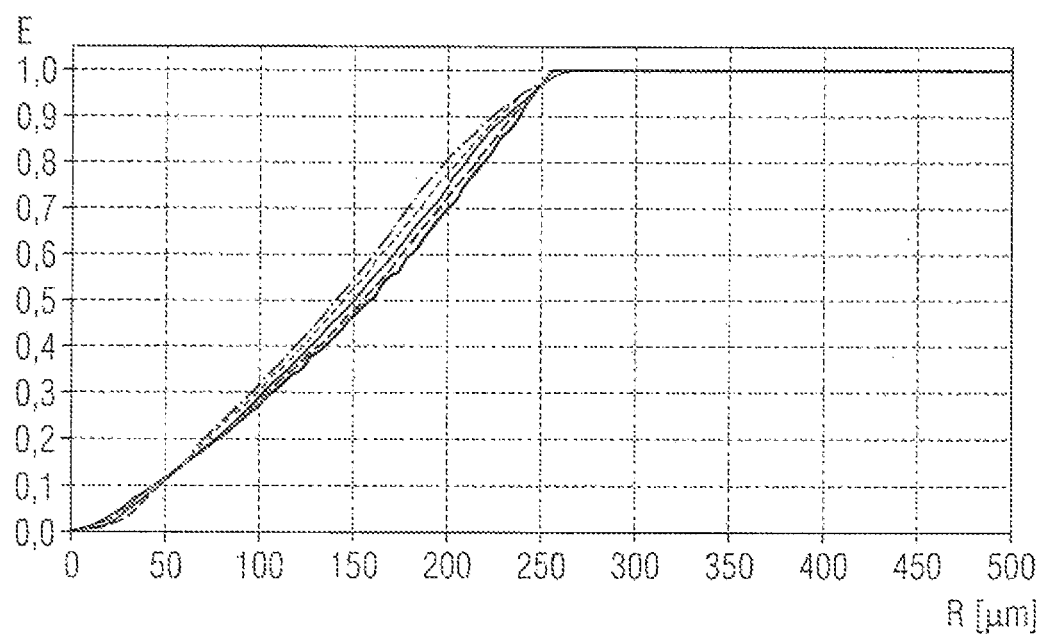

OPTOELECTRONIC APPARATUS

TECHNICAL FIELD

An optoelectronic apparatus is provided which is suitable, in particular, for detector systems, energy-generating systems such as, for instance, solar cells or projectors, for example, beamers.

BACKGROUND

DE 10 2005 033 005 A1 describes an optoelectronic chip having an active zone subdivided into a plurality of radiation-emitting regions, and a plurality of convexly curved partial regions having a larger lateral extent than the radiation-emitting regions. What is intended to be achieved with this ratio between the radiation-emitting regions and the convexly curved partial regions is that the radiation emitted by the regions impinges on the partial regions at an angle which is less than the critical angle of total reflection, such that the radiation coupling-out efficiency can be increased.

It could therefore be helpful to provide a low-loss optoelectronic apparatus.

SUMMARY

We provide an optoelectronic apparatus including an optical device with an optical structure including a plurality of optical elements and a concentrator which is a hollow body having a reflective inner area, and a radiation-emitting or radiation-receiving semiconductor chip with a contact structure including a plurality of contact elements that make electrical contact with the semiconductor chip and are spaced apart vertically from the optical structure, wherein the contact elements are arranged in interspaces between the optical elements upon projection of the contact structure into a plane of the optical structure, wherein the concentrator has an aperture on a side facing the semiconductor chip that is smaller than a side facing away from the semiconductor chip, and the optical structure is arranged on a side of the concentrator facing the semiconductor chip.

BRIEF DESCRIPTION OF THE DRAWINGS

FIG. 3 shows a schematic cross-sectional view of the semiconductor chip and the optical structure for illustrating the beam path between optical structure and semiconductor chip.

FIG. 4 shows a scatter diagram of an intensity distribution on the radiation passage area of the semiconductor chip.

FIG. 5 shows a graph representing the confined energy in an illuminated region of the semiconductor chip.

DETAILED DESCRIPTION

Figure 1:
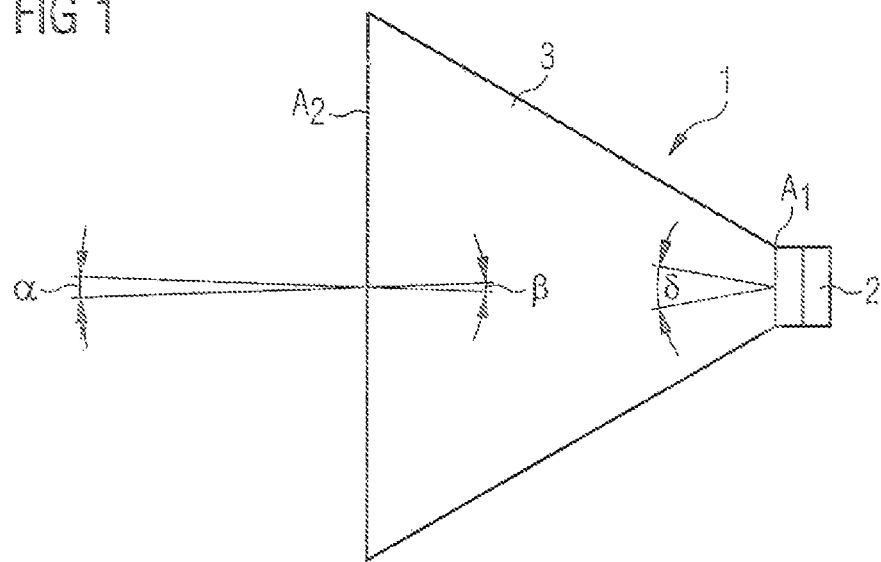
FIG. 1 shows a schematic cross-sectional view of an optoelectronic apparatus for illustrating the effect of the optical device.

In accordance with one preferred example, our optoelectronic apparatus comprises an optical device with an optical structure comprising a plurality of optical elements, and also a radiation-emitting or radiation-receiving semiconductor chip with a contact structure, which comprises a plurality of contact elements that make electrical contact with the semiconductor chip and is spaced apart vertically from the optical structure, wherein the contact elements are arranged in interspaces between the optical elements upon a projection of the contact structure into the plane of the optical structure.

The vertical spacing-apart enables the desired optical effect to be achieved, namely a concentration of the radiation in regions of a radiation entrance area of the radiation-receiving semiconductor chip separated from one another by the contact structure, or a collimation of the radiation emitted by the regions by the optical structure.

The contact structure may be applied on a radiation passage area of the semiconductor chip, the radiation passage area facing the optical device. It holds true for the radiation-emitting semiconductor chip that the radiation passage area corresponds to the radiation exit area, while in the case of the radiation-receiving semiconductor chip the radiation passage area constitutes the radiation entrance area.

Preferably, the contact structure only covers partial regions of the radiation passage area of the semiconductor chip, that is to say that the contact structure does not cover the radiation passage area over the whole area. Radiation losses caused by absorption of radiation at the contact structure are thus reduced in the contact structure that is perforated in this case.

Furthermore, the optical structure is preferably arranged on a radiation passage area of the optical device, the radiation passage area facing the contact structure. It holds true for the radiation-emitting semiconductor chip that the radiation passage area of the optical device corresponds to the radiation entrance area of the optical device, while in the case of the radiation-receiving semiconductor chip the radiation passage area constitutes the radiation exit area of the optical device.

With the optical structure, in the case of the radiation-receiving semiconductor chip, the transmitted radiation can be collected in regions of the radiation passage area which are laterally separated from one another, wherein the irradiance decreases to a relatively great extent between the regions. The contact structure is advantageously arranged in these intermediate regions having lower irradiance. The intermediate regions having low irradiance correspond, in particular, to the interspaces between the optical elements of the optical structure. The contact structure is situated outside the main beam path and, as a result, shading by the contact structure is substantially prevented. Radiation losses can be greatly reduced as a result.

In the case of the radiation-emitting semiconductor chip, the optical structure advantageously enables a "masking-out" of the contact structure such that an area disposed downstream of the optical device from the point of view of the semiconductor chip is homogeneously luminous and not interrupted by the contact structure. The contact structure produces luminous regions separated from one another and combined by the optical device or the optical structure to form a uniformly luminous area.

The contact structure can be applied to the radiation passage area of the semiconductor chip in the form of a structured coating containing an electrically conductive material, in particular, a metal.

The optical structure can be formed from a radiation-transmissive material. One suitable material is glass, for example. This has a relatively good ageing resistance with respect to short-wave radiation, in particular, ultraviolet radiation.

The optical structure advantageously has a periodic structure, that is to say that the optical elements of the optical structure are arranged regularly.

The optical elements may form a lens array or an optical grating. By way of example, the lens array can comprise a plurality of regularly arranged lenses having a convexly curved surface on the side facing the semiconductor chip. In particular, a radiation-emitting or radiation-receiving zone of the semiconductor chip can be situated in a plane or near a plane spanned by the focal points of the lenses. Consequently, the radiation impinging on the semiconductor chip is focused in the radiation-receiving zone by the optical structure, while the radiation emitted by the semiconductor chip is collimated by the optical structure.

In accordance with the optical structure, the contact structure can also have a periodic structure. In particular, the periodicity of the contact structure corresponds to the periodicity of the optical structure, that is to say that the contact elements are arranged with the same regularity as the optical elements.

In accordance with one advantageous configuration, the contact structure is formed from contact elements arranged in a reticulated fashion. The contact elements can be contact webs, in particular. Preferably, the optical structure in this case has the optical elements, for example, lenses, at the location of the interspaces of the contact structure.

Preferably, the optical device comprises a concentrator. On a side facing the semiconductor chip, the concentrator has a first aperture, which is, in particular, smaller than a second aperture of the concentrator, the second aperture being arranged on a side facing away from the semiconductor chip. With the concentrator, the chip size can be kept relatively small with sufficient irradiance, which reduces the material costs. The second aperture can advantageously be approximately 10 to 1000 times larger than the first aperture or the radiation passage area of the semiconductor chip that preferably corresponds to the first aperture. The length of the concentrator is defined by the second or first aperture and the aperture angle of the concentrator.

One advantageous configuration of the optical device provides a parabolic concentrator. The parabolic concentrator is identical in cross section to a piecewise parabola and has the property of focusing radiation incident within a specific angle with respect to the axis of symmetry in a delimited area or emitting radiation emerging from the area into a delimited angular range. Preferably, the optical structure is arranged in the region of the first aperture near the focal point.

Preferably, the concentrator is a solid body comprising the optical structure at a surface facing the semiconductor chip. The combination of concentrator and optical structure can be embodied in one piece, both elements preferably containing the same material, for example, glass. The radiation is guided in the concentrator primarily by total reflections at the outer wall.

However, it is also possible to provide the concentrator as a hollow body having a reflective inner area, the optical structure being disposed downstream of the hollow body on a side facing the semiconductor chip. In this case, the two elements are preferably two separate elements that are not produced from the same material. By way of example, the hollow body can be produced from a plastics material and have a reflective coating, which contains a metal, in particular, on the inner area. The optical structure can be formed from glass.

The semiconductor chip may comprise a radiation-emitting or radiation-receiving zone which is functional in the regions not covered by the contact structure. Preferably, the radiation-emitting or radiation-receiving zone is also functional in the regions covered by the contact structure, that is to say that the size of the functional regions preferably corresponds in total to the total area of the radiation-emitting or radiation-receiving zone.

The interspace by which the optical structure and the semiconductor chip are vertically spaced apart from one another advantageously has a different refractive index than the optical structure. By way of example, air (refractive index n=1) or silicone (refractive index, for example, n=1.4) can be situated in the interspace. The optical structure can be formed with glass (refractive index, for example, n=1.5).

Preferably, the radiation-emitting semiconducting chip is a light-emitting diode. In accordance with a further configuration, the radiation-receiving semiconductor chip is a radiation detector or a solar cell. The semiconductor chip comprises a radiation-emitting or radiation-receiving zone with a pn junction that generates or receives radiation. In the simplest case, the pn junction can be formed by a p-conducting and an n-conducting semiconductor layer directly adjoining one another. Preferably, the actual radiation-generating or radiation-receiving layer is formed between the p-conducting and the n-conducting layer. In particular, in the case of a radiation-emitting semiconductor chip, the actual radiation-generating layer can be embodied in the form of a doped or undoped quantum layer. The quantum layer can be shaped as a single quantum well (SQW) structure or multiple quantum well (MQW) structure or else as a quantum wire or quantum dot structure.

The semiconductor chip embodied as a radiation detector can have, in particular, more than one radiation-receiving zone. The radiation-receiving zones can be arranged one above another and absorb radiation having different wavelengths.

Materials suitable for the semiconductor chip are, inter alia, III-V semiconductors, in particular arsenide, phosphide or nitride compound semiconductors having the material composition $Al_nGa_mIn_{1-n-m}As$, $Al_nGa_mIn_{1-n-m}P$ or $Al_nGa_mIn_{1-n-m}N$, where $0 \leq n \leq 1$, $0 \leq m \leq 1$ and $n+m \leq 1$. In this case, the material need not necessarily have a mathematically exact composition according to the above formula. Rather, it can comprise one or a plurality of dopants and also additional constituents which substantially do not change the physical properties of the material. For the sake of simplicity, however, the above formula only includes the essential constituents of the crystal lattice (Al, Ga, In, P), even if these can be replaced in part by small amounts of further substances.

Furthermore, the semiconductor chip can contain an elemental semiconductor such as silicon or a II-VI compound semiconductor, which is particularly suitable in the case of the solar cell. Moreover, in the case of the radiation detector, germanium can be used for a first radiation-receiving zone, while a second receiving zone can be formed from a III-V semiconductor.

It should be pointed out that, in this case, "vertical" is taken to mean a direction in which the optical structure is disposed downstream of the semiconductor chip. "Lateral" should be understood to mean a direction perpendicular to the vertical direction.

Turning now to the drawings, the optoelectronic apparatus described above is explained in greater detail below with reference to FIGS. 1 to 7. Identical or identically acting elements are provided with the same reference symbols in the figures.

FIG. 1 illustrates an optoelectronic apparatus 1 comprising a radiation-emitting or radiation-receiving semiconductor chip 2 and an optical device 3.

As can be seen from FIG. 1, the optical device 3 has a first aperture $A_1$ on a side facing the semiconductor chip 2, the first aperture being smaller than a second aperture $A_2$, which is arranged on the side facing away from the semiconductor chip 2. The chip size is preferably adapted to the size of the first aperture $A_1$ and has, in particular, the same lateral dimensions as the first aperture $A_1$.

The semiconductor chip 2 can have a rectangular, in particular square, plan, wherein the plan area can assume values of between 0.0001 cm² (100 µm×100 µm) and 10 cm². The lower limit is determined by the producibility and/or effectiveness of the contact structure. The upper limit is determined by the realizability of the optical device.

One suitable size for the second aperture $A_2$ is 100 cm², for example. In this case, the semiconductor chip 2 advantageously has a plan area of 1 cm².

The angle α denotes the aperture angle of the radiation cone which emerges from the optical device 3 through the second aperture $A_2$ or enters into the optical device 3 through the second aperture $A_2$. If the radiation source is assumed to be a distant radiation source such as the sun, then the angle α is relatively small and is approximately 1° (±0.5°). In the optical device 3, the angle α of the radiation cone decreases to the angle β and is, for example, approximately 0.7° (±0.35°). On account of the maintenance of the etendue in the optical device 3, the angle δ occurring at the first aperture 1 is greater than the angle β occurring at the second aperture $A_2$ since the first aperture 1 is smaller than the second aperture $A_2$. In this case, the angle δ is 7° (±3.5°). The solid angle factor is 100.

If the semiconductor chip 2 is a radiation receiver, then sunlight with an irradiance of 1000 W/m² can pass through the second aperture $A_2$, which, as already mentioned, can have an area of 100 cm² such that a radiation power of 10 W is obtained on a radiation passage area of the semiconductor chip 2 having a size of 1 cm².

If the semiconductor chip 2 is a radiation source, radiation can be emitted with comparatively low divergence by the optical device 3. As a result of this, the optoelectronic apparatus 1 is particularly suitable for use in projectors.

Figure 2:
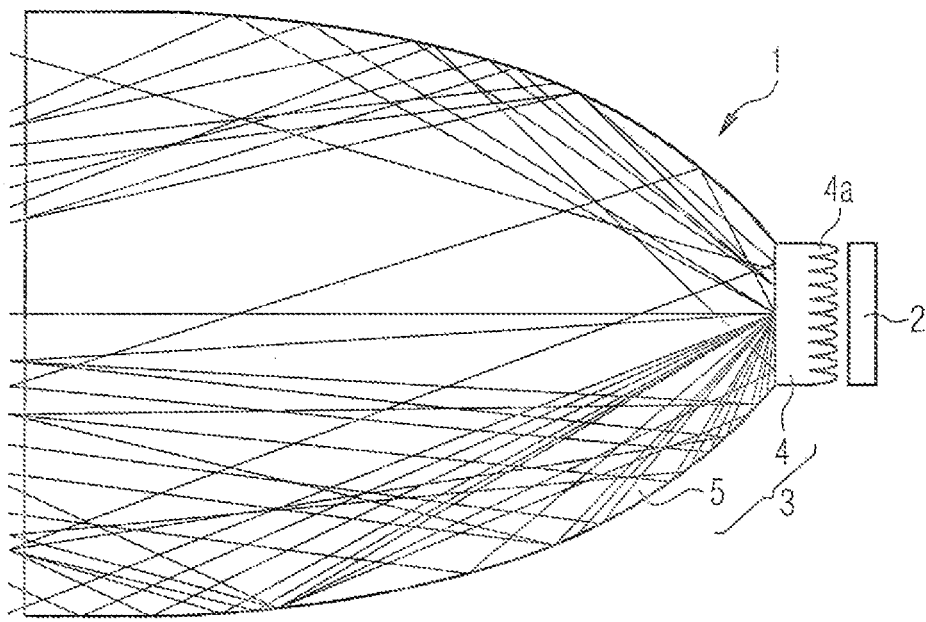
FIG. 2 shows a schematic cross-sectional view of the optoelectronic apparatus with semiconductor chip, optical structure and concentrator.

FIG. 2 shows one possible configuration of the optical device 3. The latter can comprise a parabolic concentrator 5, which guides the incident radiation through the concentrator body with as few losses as possible.

The concentrator 5 can be a solid body, for example, at the outer wall of which the radiation is subjected to total reflection and is thus kept in the concentrator 5. Alternatively, the concentrator 5 can be a hollow body having a reflectively coated inner area.

Furthermore, the optical device 3 comprises an optical structure 4 on a side facing the semiconductor chip 2. The optical structure 4 can be a separate element, which is preferably connected mechanically to the concentrator 5. Alternatively, the optical structure 4 can be embodied in one piece with the concentrator 5, that is to say that optical structure 4 and concentrator 5 are produced in one work step preferably from the same material. The latter possibility is preferably employed if the concentrator 5 is a solid body.

The optical structure 4 advantageously has a periodic structure. As illustrated, the optical structure 4 comprises a plurality of regularly arranged optical elements 4a. In particular, the optical elements 4a are lenses having a convex surface.

Preferably, the plan of the optical structure 4 corresponds to the plan of the semiconductor chip 2. Given a plan area of 1 cm², the optical structure 4 can comprise, for example, one optical element 4a per mm², that is to say that the diameter of an individual optical element 4a is approximately 1 mm.

On account of the radiation transmissivity of glass, this material can advantageously be used for the optical structure 4.

FIG. 3 shows an enlarged excerpt from an optoelectronic apparatus as illustrated in FIGS. 1 and 2.

The optical structure 4 comprises a plurality of optical elements 4a, which are embodied as lenses, in particular. This has already been explained in greater detail in connection with FIG. 2.

As can be seen from FIG. 3, the light rays—represented by lines—of a beam of rays generated by the respective optical elements 4a converge or diverge in the case of a radiation-emitting semiconductor chip. Regions B of lower intensity are present between the beams of rays impinging on the semiconductor chip 2 or the beams of rays emitted by the latter. In the regions B, the semiconductor chip 2 comprises contact elements (not illustrated) which together form a contact structure. The contact structure is preferably arranged on a radiation passage area 2a of the semiconductor chip 2.

The semiconductor chip 2 or the radiation-receiving or radiation-emitting zone does not have to be arranged directly in the plane which is spanned by the focal points of the optical elements 4a. The semiconductor chip 2 can be arranged near the plane, at a somewhat smaller vertical distance D from the optical structure 4. The distance D between the optical structure 4 and the semiconductor chip 2 is chosen, in particular, to be large enough that the contact structure can be made sufficiently large without the risk of shading by the contact structure. Furthermore, the distance is chosen to be small enough that the regions B are sufficiently large to optimally utilize the chip area.

FIG. 4 illustrates a simulated intensity distribution such as can occur on the radiation passage area 2a of a radiation-receiving semiconductor chip 2 in accordance with FIGS. 1 to 3.

The radiation passage area 2a has a size of 1 cm×1 cm. The radiation is collected in regions L which are separated from one another and the number of which corresponds to the number of optical elements 4a (FIG. 3). Therefore, 10×10 regions L occur on the radiation passage area 2a. The regions L illuminated by the beams of rays are uniformly distributed on the radiation passage area 2a and separated from one another by the regions B of lower intensity.

FIG. 5 reveals the extent of the illuminated regions L. The ordinate indicates the proportion E of the included energy within a region L having the radius R proceeding from the centroid thereof. The abscissa indicates the radius R. The different curves represent the values for different rays that impinge on the region L at different angles, in particular ±3.5°. As can be seen from FIG. 5, within a region L having the radius R=250 µm more than 95% (E=1) of the energy is confined if the radiation impinges within an angular range of ±3.5°. The average diameter of the regions L can therefore be assumed to be approximately 500 µm.

The distance between the centroids of the regions L is approximately 1 mm in this case. Consequently, the width of the regions B between the regions L can be up to 500 µm. Consequently, there is sufficient space for the contact elements in the regions B.

Figure 6:
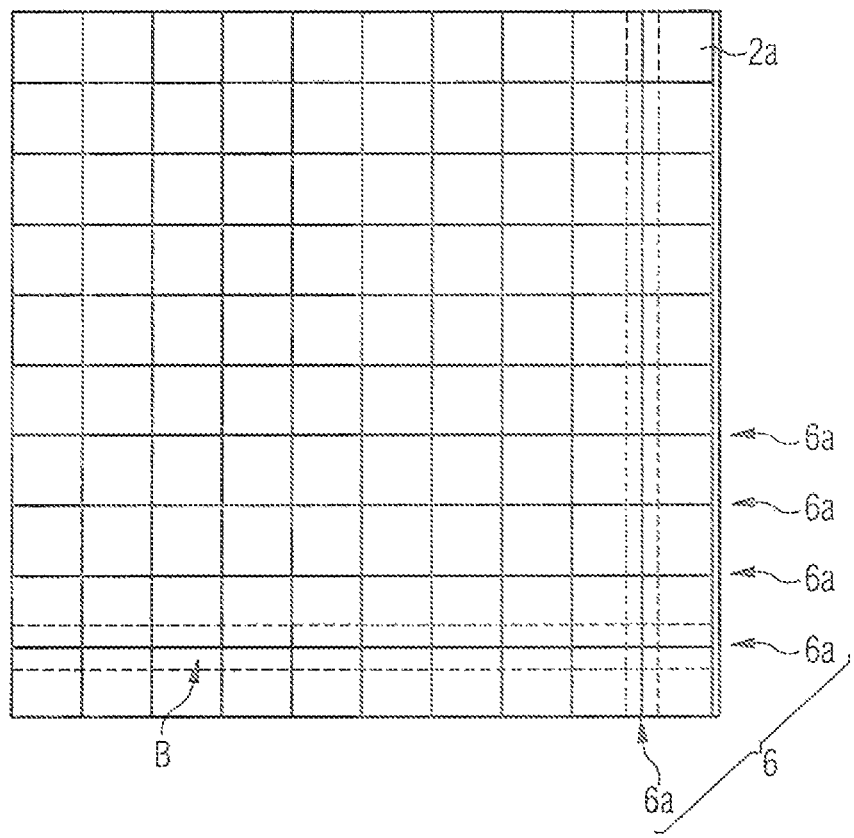
FIG. 6 shows a schematic plan view of a contract structure.

FIG. 6 shows the radiation passage area 2a illustrated in FIG. 4, the radiation passage area now being provided with contact elements 6a, which form the contact structure 6, in the regions B of low intensity. The contact structure 6 has a periodic structure, wherein the periodicity of the contact elements 6a corresponds to the periodicity of the illuminated regions L. The illuminated regions L can be assigned one-to-one to the optical elements 4a of the optical structure 4 which are illustrated in FIG. 3. Consequently, the periodicity of the contact structure 6 also corresponds to the periodicity of the optical structure 4.

The contact structure 6 is formed from contact elements 6a in the form of contact webs that are arranged in a reticulated fashion. The contact webs preferably contain a metal or a metal compound. The width of the contact webs is adapted to the width of the regions B. If the latter have a width of approximately 500 μm, then the contact webs can have a width of approximately 300 μm. However, smaller structures down to 10 μm are also conceivable, depending on the application.

Figure 7:
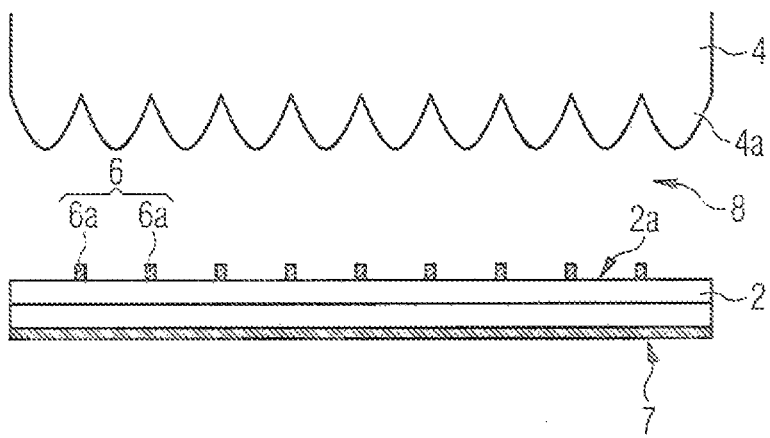
FIG. 7 shows a schematic cross-sectional view of a radiation-emitting or radiation-receiving semiconductor chip.

FIG. 7 shows an enlarged excerpt from an optoelectronic apparatus as illustrated in FIG. 2, for example. The optoelectronic apparatus comprises the semiconductor chip 2, which can be a light-emitting diode, a radiation detector or a solar cell, and the optical structure 4 having the optical elements 4a.

The contact structure 6 having the contact elements 6a in the form of contact webs is arranged on the radiation passage area 2a of the semiconductor chip 2. The contact structure 6 is vertically spaced apart from the optical structure 4. In particular, an interspace 8 is situated between the optical structure 4 and the semiconductor chip 2. The interspace 8 advantageously has a different refractive index than the optical structure 4, the refractive index being smaller, in particular. By way of example, the interspace 8 can be filled with air or silicone.

On the rear side, the semiconductor chip 2 comprises a rear-side contact 7, which can cover the semiconductor chip 2 over the whole area.

Upon a projection of the contact structure 6 into the plane of the optical structure 4, the contact elements 6a are arranged in interspaces between the optical elements 4a. In particular, the optical elements 4a are enclosed in a frame-like manner by the contact elements 6a upon a projection.

The arrangement of the optical structure 4 relative to the contact structure 6 has the effect, in the case of a radiation-receiving semiconductor chip 2, that no shading by the contact structure 6 occurs as a result of the contact structure 6.

In the case of a radiation-emitting semiconductor chip 2, with the arrangement described, more radiation can be coupled into the concentrator (not illustrated) or a projector optical unit (not illustrated) disposed downstream or the projector optical unit can be designed for a smaller etendue. This is because only the radiation between the contact elements 6a is processed by the optical structure 4. The luminous area therefore does not correspond to the size of the radiation passage area 2a, but rather is reduced by the size of the contact elements. The etendue (product of luminous area and solid angle), is therefore smaller. Therefore, an etendue-limited system with increased luminance can be obtained by an optoelectronic apparatus of this type. Such an apparatus is suitable for projectors, in particular.

This disclosure is not restricted by the description on the basis of the examples. Rather, the disclosure encompasses any novel feature and also any combination of features, which in particular includes any combination of features in the appended claims, even if this feature or this combination itself is not explicitly specified in the claims or examples.

The invention claimed is:

1. An optoelectronic apparatus (1) comprising:
   an optical device with an optical structure comprising a plurality of optical elements and a concentrator which is a hollow body having a reflective inner area, and
   a radiation-emitting or radiation-receiving semiconductor chip with a contact structure comprising a plurality of contact elements that make electrical contact with the semiconductor chip and are spaced apart vertically from the optical structure, wherein the contact elements are arranged in interspaces between the optical elements upon projection of the contact structure into a plane of the optical structure,
   wherein the concentrator has an aperture on a side facing the semiconductor chip that is smaller than a side facing away from the semiconductor chip, and
   the optical structure is arranged on a side of the concentrator facing the semiconductor chip.

2. The optoelectronic apparatus as claimed in claim 1, wherein the contact structure is applied on a radiation passage area of the semiconductor chip facing the optical device.

3. The optoelectronic apparatus as claimed in claim 2, wherein the radiation passage area of the semiconductor chip is covered by the plurality of optical elements.

4. The optoelectronic apparatus as claimed in claim 1, wherein the optical structure is a periodic structure and the optical elements form a lens array or an optical grating.

5. The optoelectronic apparatus as claimed in claim 1, wherein the optical structure contains glass.

6. The optoelectronic apparatus as claimed in claim 4, wherein the contact structure is a periodic structure having a periodicity corresponding to periodicity of the optical structure.

7. The optoelectronic apparatus as claimed in claim 6, wherein the contact structure comprises contact elements arranged in a reticulated fashion.

8. The optoelectronic apparatus as claimed in claim 1, wherein the optical structure is disposed downstream of the hollow body on a side facing the semiconductor chip.

9. The optoelectronic apparatus as claimed in claim 1, wherein the semiconductor chip comprises a radiation-emitting or radiation-receiving zone which is functional in regions covered by the contact structure.

10. The optoelectronic apparatus as claimed in claim 1, wherein an interspace between the optical structure and the semiconductor chip has a different refractive index than the optical structure.

11. The optoelectronic apparatus as claimed in claim 10, wherein air or silicone is situated in the interspace.

12. The optoelectronic apparatus as claimed in claim 1, wherein the radiation-emitting semiconductor chip is a light-emitting diode.

13. The optoelectronic apparatus as claimed in claim 1, wherein the radiation-receiving semiconductor chip is a radiation detector or a solar cell.

14. The optoelectronic apparatus as claimed in claim 1, wherein the contact structure comprises more than two contact elements electrically contacting the semiconductor chip.

* * * * *